(12) United States Patent
Siepe et al.

(10) Patent No.: US 7,654,434 B2
(45) Date of Patent: Feb. 2, 2010

(54) METHOD, DEVICE AND SYSTEM FOR BONDING A SEMICONDUCTOR ELEMENT

(75) Inventors: Dirk Siepe, Dortmund (DE); Reinhold Bayerer, Warstein (DE); Andreas Lenniger, Anroechte (DE)

(73) Assignee: Infineon Technologies AG, Munich (DE)

( * ) Notice: Subject to any disclaimer, the term of this patent is extended or adjusted under 35 U.S.C. 154(b) by 681 days.

(21) Appl. No.: 11/276,991

(22) Filed: Mar. 20, 2006

(65) Prior Publication Data

US 2006/0208037 A1 Sep. 21, 2006

(30) Foreign Application Priority Data

Mar. 21, 2005 (DE) .................. 10 2005 012 992

(51) Int. Cl.
 *B23K 31/02* (2006.01)
 *B23K 31/12* (2006.01)
(52) U.S. Cl. .............. 228/103; 228/104; 228/180.5
(58) Field of Classification Search .............. None
 See application file for complete search history.

(56) References Cited

U.S. PATENT DOCUMENTS

| | | | | | |
|---|---|---|---|---|---|
| 4,555,052 | A | * | 11/1985 | Kurtz et al. | 228/104 |
| 4,586,642 | A | * | 5/1986 | Dreibelbis et al. | 228/4.5 |
| 4,984,730 | A | * | 1/1991 | Gobel et al. | 228/1.1 |
| 5,314,105 | A | * | 5/1994 | Farassat | 228/102 |
| 6,085,962 | A | * | 7/2000 | Jacobson et al. | 228/103 |
| 6,467,678 | B2 | * | 10/2002 | Mochida et al. | 228/180.5 |
| 6,492,828 | B2 | * | 12/2002 | Ming-Hsun et al. | 324/763 |
| 6,568,581 | B2 | * | 5/2003 | Boller et al. | 228/103 |
| 6,877,650 | B2 | * | 4/2005 | Marsh et al. | 228/49.5 |
| 2001/0030548 | A1 | * | 10/2001 | Farnworth et al. | 324/755 |
| 2001/0054908 | A1 | * | 12/2001 | Farnworth et al. | 324/755 |
| 2004/0150409 | A1 | * | 8/2004 | Yamaoka et al. | 324/519 |
| 2004/0221653 | A1 | * | 11/2004 | Farassat | 73/582 |
| 2005/0040839 | A1 | * | 2/2005 | Neaves et al. | 324/765 |
| 2005/0046428 | A1 | * | 3/2005 | Tesdahl et al. | 324/658 |
| 2005/0242824 | A1 | * | 11/2005 | Parker et al. | 324/538 |
| 2005/0253616 | A1 | * | 11/2005 | Parker et al. | 324/765 |
| 2006/0152244 | A1 | * | 7/2006 | Neaves et al. | 324/765 |
| 2006/0170446 | A1 | * | 8/2006 | Neaves et al. | 324/765 |

(Continued)

FOREIGN PATENT DOCUMENTS

JP 63007643 1/1988

(Continued)

OTHER PUBLICATIONS

Elektrische Kontaktierungen in Mikrosystemen—Drahtbonden, (www.tu.cottbus.de/MST/lehre/scripte/UES-Bonden.pdf, 16 pages.

(Continued)

*Primary Examiner*—Kiley Stoner
(74) *Attorney, Agent, or Firm*—Coats & Bennett, P.L.L.C.

(57) ABSTRACT

The invention relates to a method and also a device and a system for bonding a semiconductor element (4), in which various contact areas (8) of the semiconductor element (4) are successively connected to terminal areas (2, 3, 7) by means of bonding wire elements (6) and in which an electrical variable influenced by the semiconductor element (4) is acquired during the bonding operation.

11 Claims, 10 Drawing Sheets

U.S. PATENT DOCUMENTS

2006/0181301 A1* 8/2006 Neaves et al. ............... 324/765
2006/0197539 A1* 9/2006 Schneider et al. ........... 324/538
2007/0007978 A1* 1/2007 Parker et al. ................ 324/754

FOREIGN PATENT DOCUMENTS

JP          2003059981          2/2003

OTHER PUBLICATIONS

Farhad Farassat, Wire bonding process control (www.seiconductorfabtech.com from the company F & K Delvotech GmbH, 9 pages, Jan. 17, 2005.

* cited by examiner

METHOD, DEVICE AND SYSTEM FOR BONDING A SEMICONDUCTOR ELEMENT

PRIORITY

This application claims priority from German Patent Application No. 10 2005 012 992.7, which was filed on Mar. 21, 2005, and is incorporated herein by reference in its entirety.

TECHNICAL FIELD

The invention relates to a method for bonding a semiconductor element, in which various contact areas of the semiconductor element are successively connected to terminal areas by a bonding device by means of bonding wire elements, and to a device and a system for carrying out the method.

BACKGROUND

As integration density increases, logic circuits and memory chips are becoming ever smaller and contain an increasing number of electrical terminals in a confined space. Usually, the semiconductor element is placed on a substrate and the latter bears terminal areas which are connected to contact areas of the semiconductor element by means of bonding wires. During the contacting of such pieces of bonding wire with terminal areas and contact areas, high precision is required, since there is little space available. In this case, wires with a diameter of between 17 and 100 μm. are used for thin wire bonding, wires with a diameter of between 100 and 500 μm. are used for thick wire bonding. The corresponding terminal areas are metallized areas, for example of gold, copper or aluminum. The bonding wires may likewise consist of one of these materials and are brought to the desired cross section by repeatedly drawing them through diamond dies.

Thermocompression, ultrasonic and thermosonic methods are used in most cases for the automatic bonding. The three methods mentioned are described, for example, in a manuscript from the technical university of Cottbus, which is available on the Internet at "www.tu-cottbus.de/MST/lehre/scripte/UES-Bonden.pdf" with the title "Elektrische Kontaktierungen in Mikrosystemen—Drahtbonden" [Electrical contacting in Microsystems—wire bonding].

In the case of the thermocompression method, also known as ballhead bonding or nailhead bonding, the joining of the bonding wire to the terminal area takes place by exposure to heat together with a compressive force. The connection created is radially symmetrical.

In the case of ultrasonic bonding, firstly a bonding wire is pressed onto a terminal area by a tool (wedge) and then ultrasound is introduced into the bonding tool, so that the bonding wire moves over the terminal area in a rubbing manner with a frequency of approximately 40 kHz to 150 kHz.

In a first phase of the bonding process, any kind of disruptive materials are thereby rubbed away by the friction between the parts being joined. In the second phase, in which the materials to be connected lie right against one another, the temperature increases as a result of friction until the areas being joined lie against one another virtually without any distance between them and the increased temperature causes diffusion effects to occur. In this phase, the parts being joined adhere to one another and the joining tool comes away from the bonding wire and brushes over its surface, which leads to further heat input, which anneals the connection and prevents the occurrence of brittle locations.

Modern bonding devices provide as a measured variable during the bonding process on the one hand the reflected ultrasound output, on the other hand the deformation of the bonding wire which is lowered onto the terminal area. Correspondingly measured parameters show a typical reproducible variation over the bonding time.

Modern bonding devices operate in an automated manner and are programmable, so that the bonding of a semiconductor element can take place at bonding rates of approximately 10 terminals per second. In the case of this process, defects repeatedly occur, manifested by modules which do not operate or do not operate sufficiently reliably.

Various methods of attempting to lower failure rates for the automated bonding process are known.

For example, the so-called Motionblitz system is known, in which the tool is photographed with a high-speed camera during the bonding operation, in order to allow wrong movements of the tool, but also of the restraint of the workpiece, to be detected by a subsequent analysis and eliminated by optimization of the process.

Furthermore, the website "www.Semikonduktorfoptech.com" discloses a "Wirebonding process control" system from the company F & K Delwotech GmbH, in which the bonding wire deformation and the reflected ultrasound output of the ultrasonic bond are continuously measured during the bonding process. It can be detected from the variation of the deformation and the ultrasound output whether the bonding operation is progressing typically with a good result, or whether the case concerned is a special case, for example as a result of contamination of the substrate surface or the like. The measured values are assigned to the respectively measured semiconductor element or module and stored in a memory device, so that during the subsequent test a failed part can still be retrospectively assigned the measured values of the bonding operation. It can then be found out whether the failure was caused by an irregularity in the bonding process and possible readjustment of the process is required.

Immediate discontinuation of the bonding process is also given as a possibility, if it is found by analysis of the measured data during the bonding process itself that there is a fault.

The method described allows the bonding process to be tracked within narrow limits on the basis of the measured variables required. However, only faults which are specifically associated with the mechanical operation of ultrasonic bonding, and defects thereby occurring, are detected.

However, it would be desirable to allow a comprehensive defect analysis which nevertheless allows measured variables to be assigned in each case to the individual semiconductor element both during the bonding operation and retrospectively.

SUMMARY

The present invention is based on the object of achieving this while avoiding the disadvantages of the prior art.

This is achieved by the features of the independent patent claim 1. Refinements and developments of the idea of the invention are defined in subclaims.

It was previously customary during the bonding operation for the mechanical parameters that can be determined by the bonding device only partly to be stored also in a time-resolved form.

The electrical properties of the bonded semiconductor element were in each case measured only statically after bonding operation. At this point in time, however, in the production process it can only be decided whether or not the component is usable. It is virtually impossible to distinguish whether the semiconductor element was already defective before the bonding operation or whether possible defects are caused by the semiconductor element itself and not by the bonding operation.

It is therefore meaningful for an electrical variable characterizing the semiconductor element to be continuously acquired and stored during the bonding operation. For example, first a gate wire, which connects a gate of the semiconductor element to a terminal area, may be bonded. This terminal may then form a pole of an electrical measuring circuit, while the bonding device represents the other pole. In this way it is possible for example when a DC voltage is applied to measure a short-circuit between a gate and, for example, emitter terminals of the semiconductor element by a resistance measurement, said short-circuit in each case indicating damage to the semiconductor element. With this measurement it is possible to detect a defect of the semiconductor element directly when it occurs, even during the bonding operation, or at least retrospectively ascribe a time to a defect which has already occurred earlier.

It goes without saying that it is also possible before the bonding operation to check the semiconductor element once again to ascertain that it is intact. If a defect is detected, the semiconductor element can be segregated if it occurs before bonding. If a defect occurs during the bonding operation, it can be detected by the time-resolved acquisition and storage which step of the bonding process caused the defect and the step can be checked and corrected if necessary in the process design or in the control program of the bonding device. In this way, the bonding process can be continuously optimized in order to lower the reject rate.

The measurement may also take place contactlessly, by an AC voltage being applied, for example as a sinusoidal voltage or delta voltage, to the bonding device on the one hand and the part that is insulated with respect to the bonding device, for example a rubber support, on the other hand. The part that is insulated with respect to the bonding device is in the direct proximity of the semiconductor element and is coupled to the latter capacitively by a conducting surface. Changes in the gate-emitter path, in particular a leakage current or a short-circuit, are manifested by a change, for example of the variation of impedance or of the IV characteristic, which can be measured and presented.

If it is at the same time observed which point the bonding process has reached, the defect occurring can be identified by specific steps of the bonding process. As a result, a location-resolved acquisition of defects in the bonding process is possible in particular. If, for example, a semiconductor component is bonded to a number of contact wires connected in parallel, it can be established directly during the bonding process whether each individual contact is produced without any defects and, if a defect occurs, on the one hand the bonding process is immediately discontinued, which saves time and material costs, and on the other hand the defect is assigned to a specific contact point and consequently to a specific step of the bonding process.

The measurement of the impedance is typically carried out by applying an AC voltage between 100 Hz and several kHz and measuring the capacitive resistance.

To be able to assign the occurrence of a defect as accurately as possible to the individual steps of the bonding operation, the reflected ultrasound output, if an ultrasonic bonding device is concerned, and/or the deformation of the bonding wire are advantageously continuously acquired and stored at the same time as the acquired electrical variable.

This may take place for example in a three-channel storage oscilloscope, which however is for the most part meaningful for laboratory operation, whereas for industrial production corresponding data should be stored in a database. In this way, it can be shown after the completion of the bonding process on the one hand that all the steps have been properly performed, without irregularities occurring, so that the component created can be certified.

On the other hand, if defects occur, it is possible to analyze in which step of the bonding process these occurred and the corresponding steps can be corrected and improved.

If at the same time each measured semiconductor element is assigned an identification number, it is then also possible retrospectively to assign specific measured values to entire batches of semiconductor elements. As a result, for example, defective parts can also still be recalled after delivery. Furthermore, in the case of defects occurring later, it can be demonstrated that the components were satisfactory when they left the production plant, whereby the situation concerning the producer's liability can be improved with lasting effect.

If certain deviations from required parameters are detected during the measurement, but are still permissible, the component can also be certified as acceptable and second-class.

To be able to assign a step of the bonding process at any time to the measured values of the electrical variable acquired in a time-resolved form, for example the capacitance or the impedance, the leakage current or the IV characteristic, it may also be advantageous to make a specific trigger signal of the bonding device the basis of the time measurement and storage of the measured data.

To carry out the method according to the invention, the bonding device typically has a generator for an AC voltage, which is applied in a way corresponding to the statements made above, and also a device for measuring the electrical variable, in particular the variation of the impedance, and a data acquisition device, which stores the measured values of the electrical variable and other parameters which the bonding device supplies. An evaluation of the data by means of an evaluating device may take place after completion of the bonding process, but also already during the bonding process, in that at least the electrical measured variable is compared with setpoint values, which are either prescribed as fixed values or else temporally depend on the phase of the bonding process just passed through. Consequently, specific measured variable progressions can be compared with setpoint value progressions. If the deviation from a setpoint measured value or setpoint measured value progression is too great, the evaluating device indicates the deviation, stores corresponding references in the database of the data acquisition device and outputs a signal by means of which, for example, the bonding device can be stopped, the individual component segregated and even, in the event of repeated segregation, an entire batch of semiconductor elements discarded. The entire system, comprising the bonding device, the data acquisition device and a controlling device, is suitable for the fully automatic control of the bonding process with simultaneous monitoring of the quality of the products. If defects occur, they can be stopped by analysis of the measured values by a laboratory assistant resulting in the bonding process being changed, or, in the case of specific deviations, bonding parameters can also be adjusted in an automated manner in order to achieve uniform quality.

The invention consequently allows on the one hand the rapid discontinuation of an individual bonding operation after detection of a defect or the discontinuation of a series if it is noticed that the current defects occur in one batch, and also optimization of the bonding process between various production series or else continuously during a production series.

Defects may be assigned to bonding operations of individual bonding wire elements, in that for example as a result of incorrect control they do not reach the right point of the substrate or non-optimum bonding parameters are applied. Therefore, a location-resolved acquisition of defects during the bonding process is made possible. In particular, bonding positions on a semiconductor element that are in principle worse to bond, and consequently more susceptible to defects, can be determined with this method. Conditions of the semiconductor element which make it more difficult for a standard bonding process to work are also discovered and defects which depend on the semiconductor elements can be easily separated from those which depend on the bonding process. Corresponding testing of the components by tensile tests and shearing tests of the bonding wire connections can consequently be reduced to a minimum. This appears to be of value in particular because it is scarcely possible to conclude the precise cause of a defect from the occurrence of defects that are evident in destructive tests of this type.

In addition to the electrical variable, it goes without saying that the measured values that are in any case provided by the bonding device can also themselves be meaningfully evaluated, in order for example to track the time interval between two bonding operations of one and the same bonding wire element on the basis of the time-resolved ultrasound reflection and, given known movement parameters of the bonding head, conclude from this the length of the bonding wire elements. This makes it possible to conclude on the one hand the length of the bonding wire and on the other hand the height of the loop created by it. It is important that, in the case of a semiconductor element, the lengths of the bonding wire at all terminals are on the one hand reproducible and on the other hand equally long as far as possible, since unplanned irregularities cause increases in resistance, which lead to instances of partial heating, which have the consequence of further damage and consequently can destroy the entire semiconductor element. Correspondingly, it is also possible, for example, for measurements of the deformation of the bonding wire to be evaluated.

If the reflected ultrasound signal is analyzed more exactly, it is possible also to conclude from it, or its variation over time, and from the measurement of the electrical variable oscillations of the clamping of the semiconductor element, which put the quality of the bonding greatly at risk, since oscillation of the substrate can interfere with the oscillating movement of the ultrasonically activated end of the bonding wire that is necessary for ultrasonic welding and can put at risk the precise positioning of the bonding connection. Inappropriate clamping of this type can also be discovered by analysis of the ultrasound reflection or else of the measured electrical variable and then specifically stopped.

BRIEF DESCRIPTION OF THE DRAWINGS

The invention is described in more detail below on the basis of an exemplary embodiment shown in the figures of the drawing. The invention thereby relates on the one hand to a method, on the other hand to a bonding device and also to a more comprehensive system which contains the bonding device. In the drawing:

FIG. 1 schematically shows a semiconductor element on a substrate in a three-dimensional view, FIG. 2 schematically shows the operating mode of a bonding device.

DETAILED DESCRIPTION

Figures 1, 2:
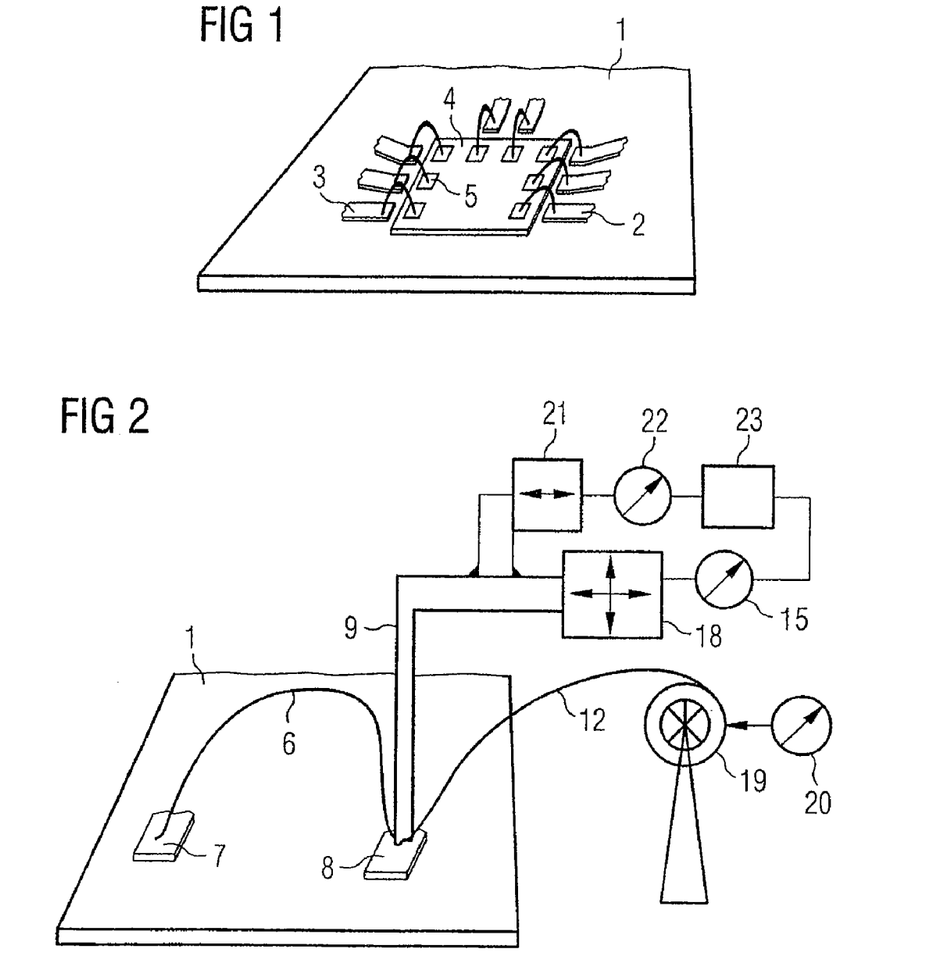

FIG. 1 shows a substrate 1, for example of a ceramic, which bears interconnects which end in terminal areas 2, 3, which lie in the direct vicinity of a semiconductor element 4.

The semiconductor element 4 has contact areas 5, which are connected to the terminal areas 2, 3 by means of bonding wires. Bonding wires of this type may consist for example of gold, copper or aluminum and are between several 10 s and some 100 s of microns thick. Connections between bonding wires and terminal areas are particularly favorable if they consist of the same material. In the case of different materials, diffusion effects which proceed from one metal into the other at a different rate than in the opposite direction cause disturbances in the metal matrix which can lead to damage of the contact. However, interposed metal layers of correspondingly suitable third materials can prevent this.

Figure 3:
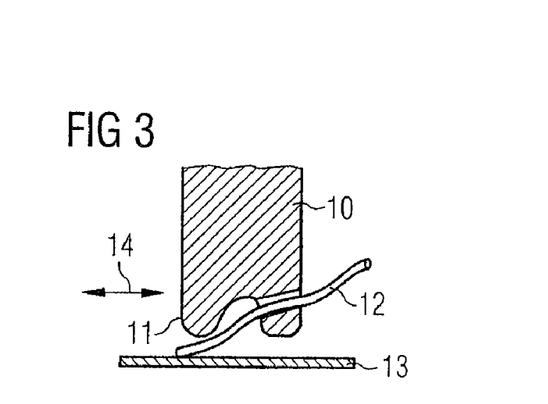
FIG. 3 shows an ultrasonic bonding head.

The actual bonding connection between a bonding wire 6, which is represented in FIG. 2, and a terminal area 7 or a contact area 8, which are represented only schematically in FIG. 2, is produced by means of a bonding device, for example by ultrasonic bonding. FIG. 2 shows this schematically. It illustrates an ultrasonic bonding tool 9, which at its lower tip has a so-called wedge, which in FIG. 3 is shown enlarged and is designated by 10. This tool has a bead 11, which presses the bonding wire 12 onto a terminal area 13 and moves it in an alternating manner in the direction of the arrow 14 at the fed-in ultrasonic frequency parallel to the surface of the terminal area 13. In a first phase, this leads to cleaning of the surfaces rubbing against one another between the bonding wire and the terminal area 13, in the second phase to a deformation of the material with subsequent flowing of the surfaces into one another and in the third phase to a solidification of the connection. In the third phase, the bonding wire is already attached to the terminal area and the wedge 11 runs along the standing bonding wire with the ultrasonic frequency.

Figure 5:
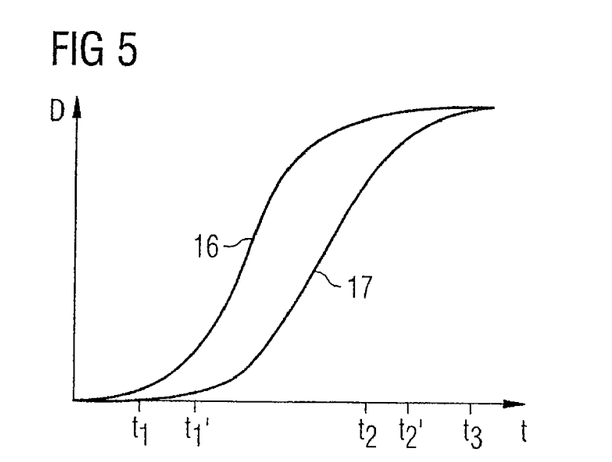
FIG. 5 shows a measuring curve of the bonding wire deformation during the bonding operation in two variants.

The deformation of the bonding wire perpendicularly to the terminal area 13 that accompanies this operation is measured by means of a deformation measuring device 15, as represented in FIG. 2, and a typical measuring curve is presented in two variants 16, 17 in FIG. 5. The deformation is plotted on the y-axis, while the time is represented on the x-axis. The curve 16 shows a bonding operation in which, in the first phase up to the point in time $t_1$, for the most part cleaning of the surfaces has taken place, in the second phase up to $t_2$, the actual contact is produced and then, approximately up to the time $t_3$, the contact solidifies. According to the curve 17, the entire bonding operation proceeds with a time delay. The corresponding times are designated by $t_1'$, $t_2'$. At the beginning of the bonding operation, there is obviously a delay. This is an indication that the surfaces of the bonding wire or of the terminal areas are not in the expected clean form. Such a finding may, for example, lead to the bonding wire being changed or a batch of semiconductor elements being cleaned before continuing with the bonding process.

FIG. 2 shows, inter alia, a controlling and driving device 18 for the bonding tool, which brings it to the point of the substrate where a bonding contact is to be produced. A device for moving and turning the substrate 1 may also be additionally provided. The controlling and driving device 18 controls the bonding tool in the xy directions over the surface of the substrate and additionally in the z direction, in order to bring the bonding wire into contact with a terminal area.

As represented in FIG. 3, the bonding wire is led through an eyelet of the bonding tool or through a wire guiding capillary, so that in each case a free end of the bonding wire can also be moved along with the bonding tool. The bonding wire 12 is in this case wound up on a spindle 19, which has an angle measuring instrument 20, by which it can be established how much of the bonding wire has been unwound in each case. While the bonding tool produces a bonding connection with the aid of the wedge 11, the spindle 19 is stationary, to continue with the unwinding when the bonding tool moves to the next bonding point. Between two holding points of the spindle 19 it can then be determined by means of the angle measuring instrument 20, but also by the time elapsing until the next bond, what length of bonding wire has been unwound and used for a bonding connection. The length of bonding wire measured in this way can be determined to within $\frac{1}{10}$ mm.

The bonding device has an ultrasound drive 21, which is connected to the bonding tool 9 and activates it in the direction parallel to the surface of the substrate 1 with an alternating movement at ultrasonic frequency, for example of the order of magnitude of approximately 40 kHz to 150 kHz. At the same time, the reflected ultrasound output is measured by means of the measuring device 22 and passed to the memory device 23, which at the same time also records the deformation of the bonding wire in the z direction acquired by the deformation measuring device 15. In addition to the respective measured values in two channels, the respective measuring time is stored as a third channel, so that the progression of the two acquired measured variables can be presented in a time-resolved form. For example, the measurements are begun with the first touchdown, that is to say the contact of the bonding wire on a terminal area, or with some other triggering signal generated in the bonding device. During the bonding or later, the quality of an individual bonding connection can also be assessed by analysis of the measuring curves in the memory device 23. The corresponding measuring curves are, for example, numbered and can be assigned to the individual bonding connections, even retrospectively. Entire sets of measurements are then assigned to an individual substrate.

Figure 4:
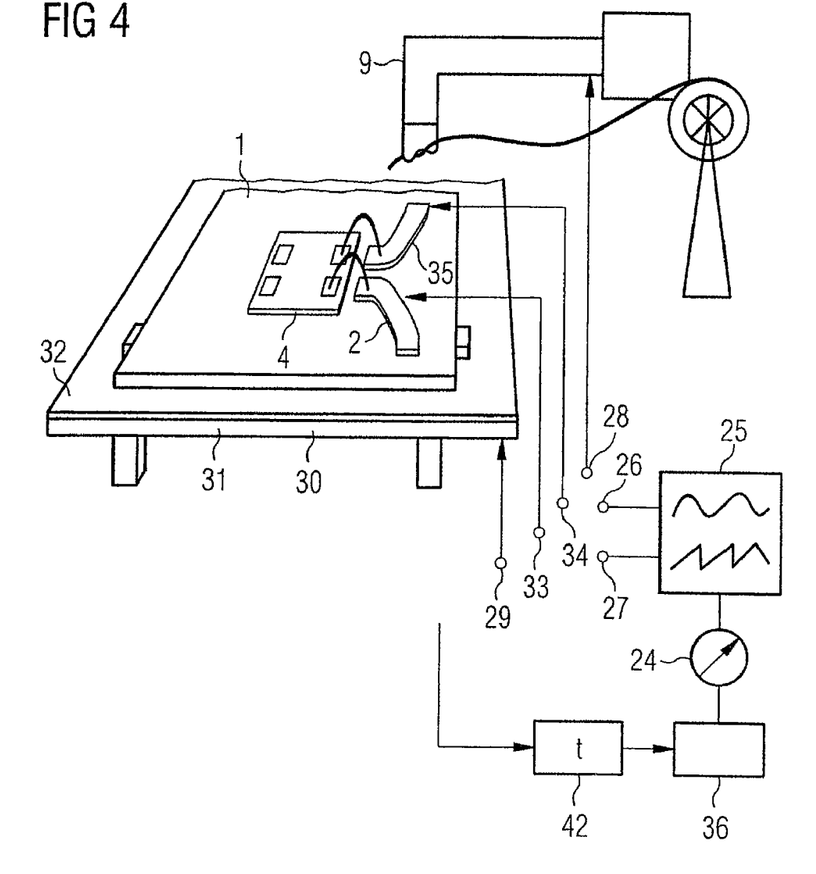
FIG. 4 shows a bonding device with a measuring device for an electrical variable.

FIG. 4 shows a measuring device which has for the most part all the devices that are represented in FIG. 2. In addition, the bonding device has an impedance measuring device 24, which is connected to an AC voltage source 25, which for its part can be connected to two parts of the bonding device or of the semiconductor elements that are insulated from one another.

In FIG. 4, various variants are represented, but it is also possible for only a single one of these to be realized in the case of a bonding device. The AC voltage 25 is available at the terminals 26, 27. On the one hand, a pole 26 may be connected to a terminal 28 of the bonding device, while the other terminal 27 is connected to a terminal 29 of an insulated base 30 for the substrate 1. The base 30 comprises a lower layer of rubber 31 and an upper metallization 32. What is important is that the base 30 is electrically insulated with respect to the bonding device with the bonding tool 9. Between the base 30 and the bonding device there is consequently a capacitance, which changes as a result of the presence of the substrate 1 or the semiconductor element 4. The changing of the impedance is also dependent, inter alia, on how the individual terminals of the semiconductor element 4 are connected to terminal areas 2 on the substrate 1. The substrate is as it were capacitively coupled to the capacitor formed between the base 30 and the bonding device. This produces an overall capacitance which may well be different depending on whether or not the bonding wire connections between the semiconductor element 4 and corresponding terminal areas 2, 3 are produced as desired and with full conduction. Furthermore, the impedance is dependent, for example, on the feedthrough of a gate-emitter path in the semiconductor element. If such a connection is defective, this is evident from the corresponding measurement in the measuring device 24 and the bonding operation can be discontinued because of the damage.

It is consequently not necessary to wait until the semiconductor element 4 is completely bonded to subject it to electrical testing. As a result, time is saved in the bonding process. Furthermore, while the other measurements, such as for example of the reflected ultrasound output and the deformation, are being carried out, at the same time the electrical variable can also be measured. If it is found during the bonding process that an unplanned change of the impedance occurs, a defective change of the semiconductor element as a result of the bonding process can be concluded. The bonding program can then be altered specifically at the point at which the defective change was found. In this way, the number of rejects in a series is drastically reduced.

The electrical measuring method and its advantages are to be explained on the basis of FIGS. 6 to 9 and 11 to 14, which show results of measurements of an electrical variable during a bonding process.

The measuring signals represented in FIGS. 6 to 9 and 11 to 14 were generated by a device with which firstly a gate of a semiconductor element, which forms the first pole of the voltage measurement, was bonded. Subsequently, the emitter of the semiconductor element, either a single contact or a number of contacts connected in parallel, is bonded. The bonding device is in this case grounded and forms the second pole for the voltage measurement. A DC voltage is applied in this case for the measurement.

Figure 6:
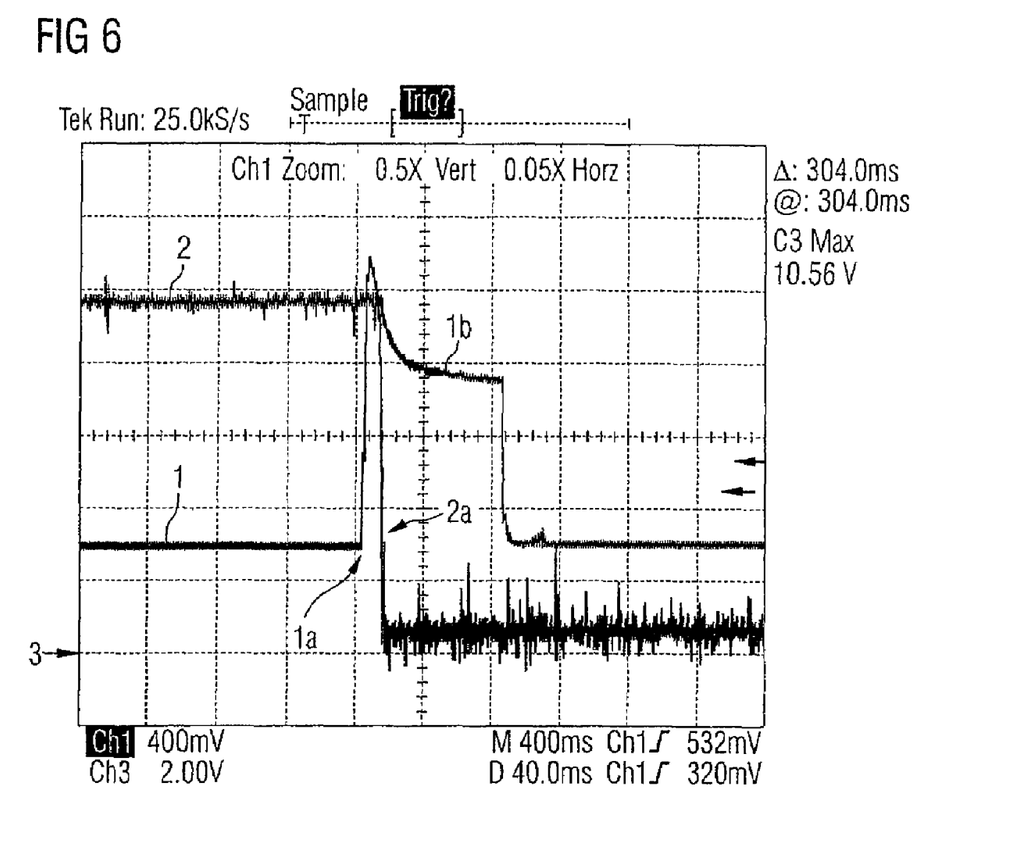
FIG. 6 shows a first measuring curve of the voltage variation during a first bonding process.

FIG. 6 shows in curve 1 the variation over time of the reflected ultrasound output. When the bonding device makes contact, the signal rises strongly at point $1a$ of the curve 1, to fall away again subsequently in the progression $1b$ of the curve 1 when the bond is formed. The curve 2 shows the measuring signal of the measured electrical variable, in the present case the voltage between the gate and the emitter during the bonding process. The sharp drop in the voltage of the curve 2 at point $2a$ clearly shows the short-circuit produced during bonding between the gate and the emitter. It is immediately evident from such a progression of the measured electrical variable at which point in time and in which step of the bonding process, consequently with which bond, a defect occurred, so that the present semiconductor element can be segregated.

Figure 7:
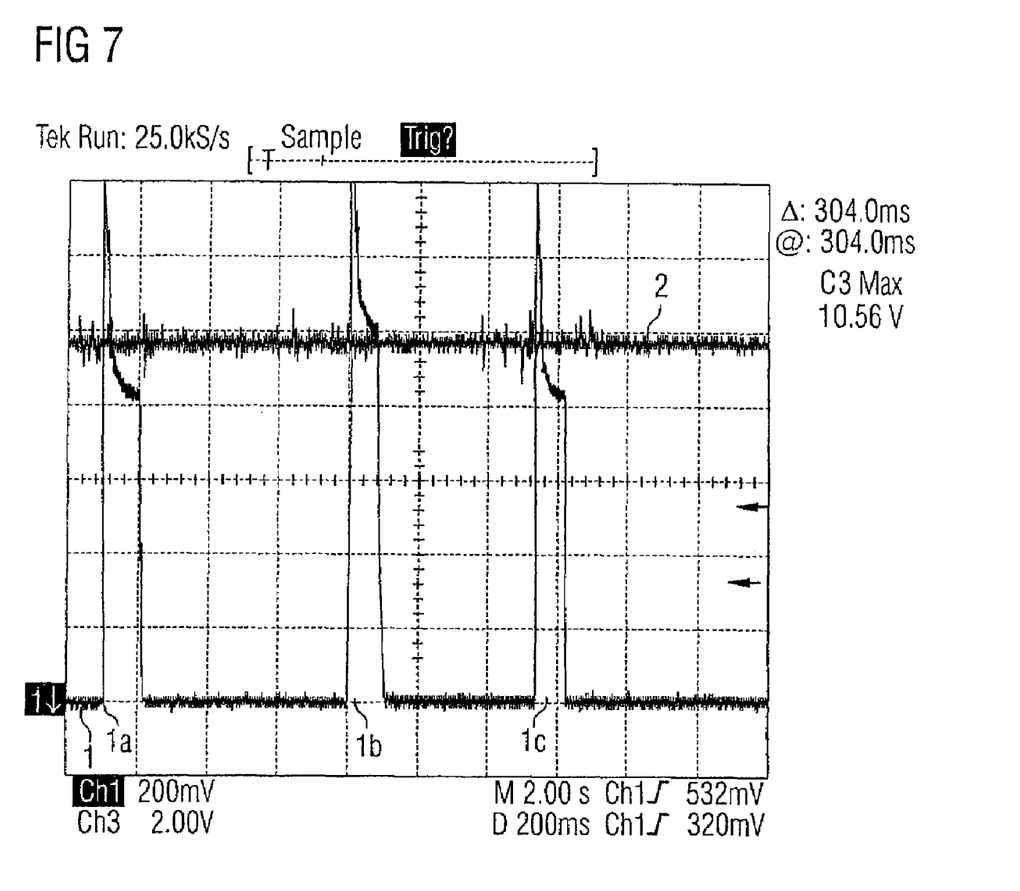
FIG. 7 shows a second measuring curve of the voltage variation during a second bonding process.

In FIG. 7, three successive bonding processes of a semiconductor element are represented. The curve 1 in turn shows the variation over time of the reflected ultrasound output, the respective bonding process being carried out at points 1a, 1b and 1c. The curve 2 in turn represents the measured electrical variable, in the present case the voltage between the first-bonded gate and the subsequently bonded emitters. The signal does not exhibit any drops, but for the most part has a constant progression, so that it is immediately evident that no damage to the component has occurred during the bonding process. However, the variations in the levels of the signals during the individual bonding processes 1a, 1b and 1c are evident. A different quality of the various bonds can be concluded from the different progression of the signals of the bonding processes. In an ideal case, the signals of the individual bonding processes 1a, 1b and 1c should have an identical progression.

Figure 8:
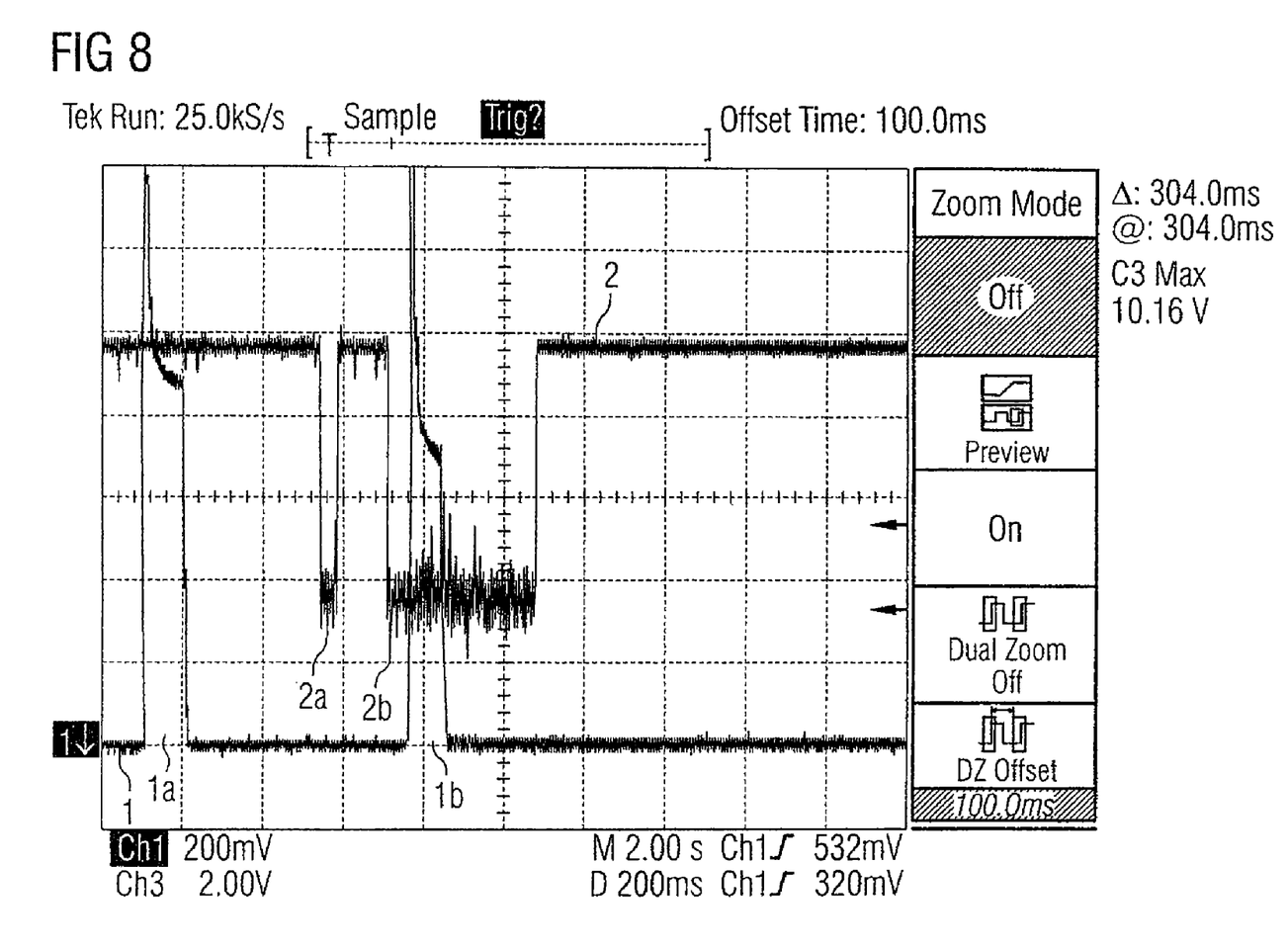
FIG. 8 shows a third measuring curve of the voltage variation during a third bonding process.

FIG. 8 shows a further example of a measured bonding process with two bonding steps. The curve 1 illustrates the variation over time of the reflected ultrasound output, which shows a bonding process respectively at points 1a and 1b. The curve 2 in turn shows the variation over time of the voltage between a first-bonded gate and the subsequently bonded emitters. Between the two bonding steps 1a and 1b, a voltage drop is evident in the curve 2 at point 2a. This indicates a defect of the semiconductor structure that has not been caused by the bonding. The voltage drop at point 2a concerns the touchdown, that is the setting down of the bonding tool on the semiconductor surface without any effect of ultrasound output. The voltage increase between the touchdown and the actual bonding operation (from point 2b) makes this clear, since here the wire is once again removed from the surface. This effect can only be observed in the case of the first emitter bond, and is consequently a check on the condition of the chip.

Figure 12:
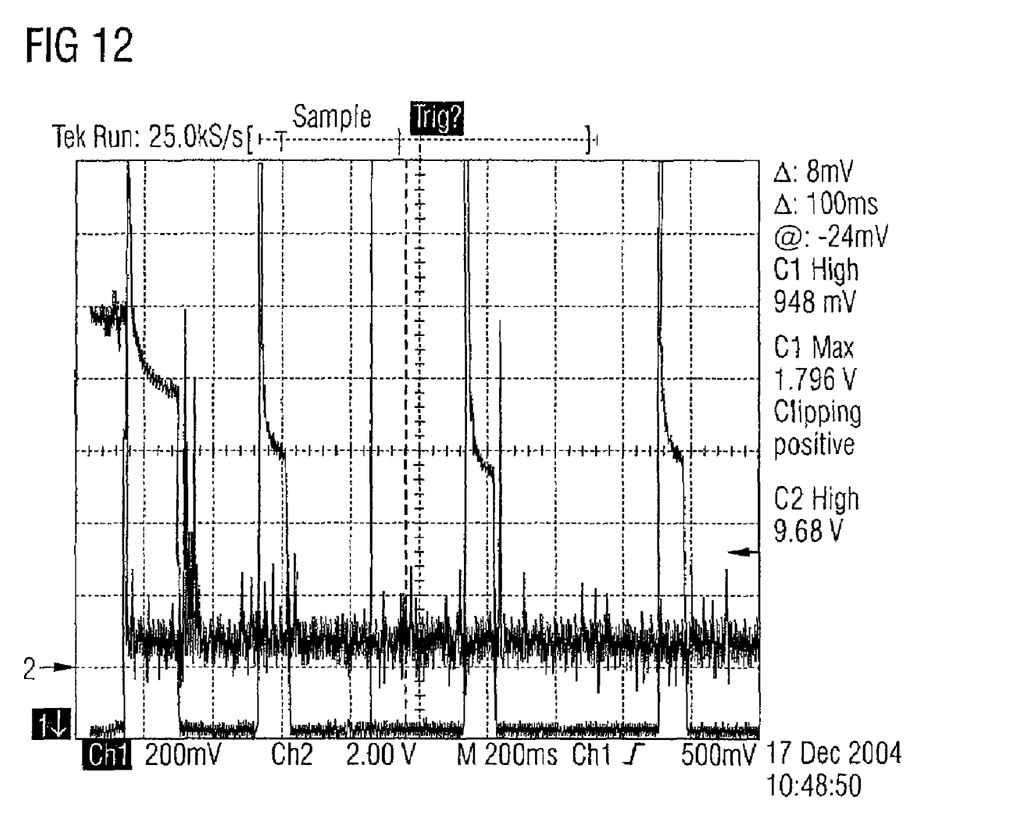
FIG. 12 shows a progression of a bonding process with destruction of the semiconductor structure already having occurred as a result of a previous bonding process.

It is important for the reliability of the process during bonding that defects that are not caused by the bonding process are also not assigned to them, as is the case with the progression described. In the case of a bonding defect, the voltage drop persists from the first contact with the surface to be bonded until cutting off, as is shown FIG. 11. The subsequent bonding connections show this voltage drop already when the first common surface is contacted, as represented in FIG. 12.

Figure 13:
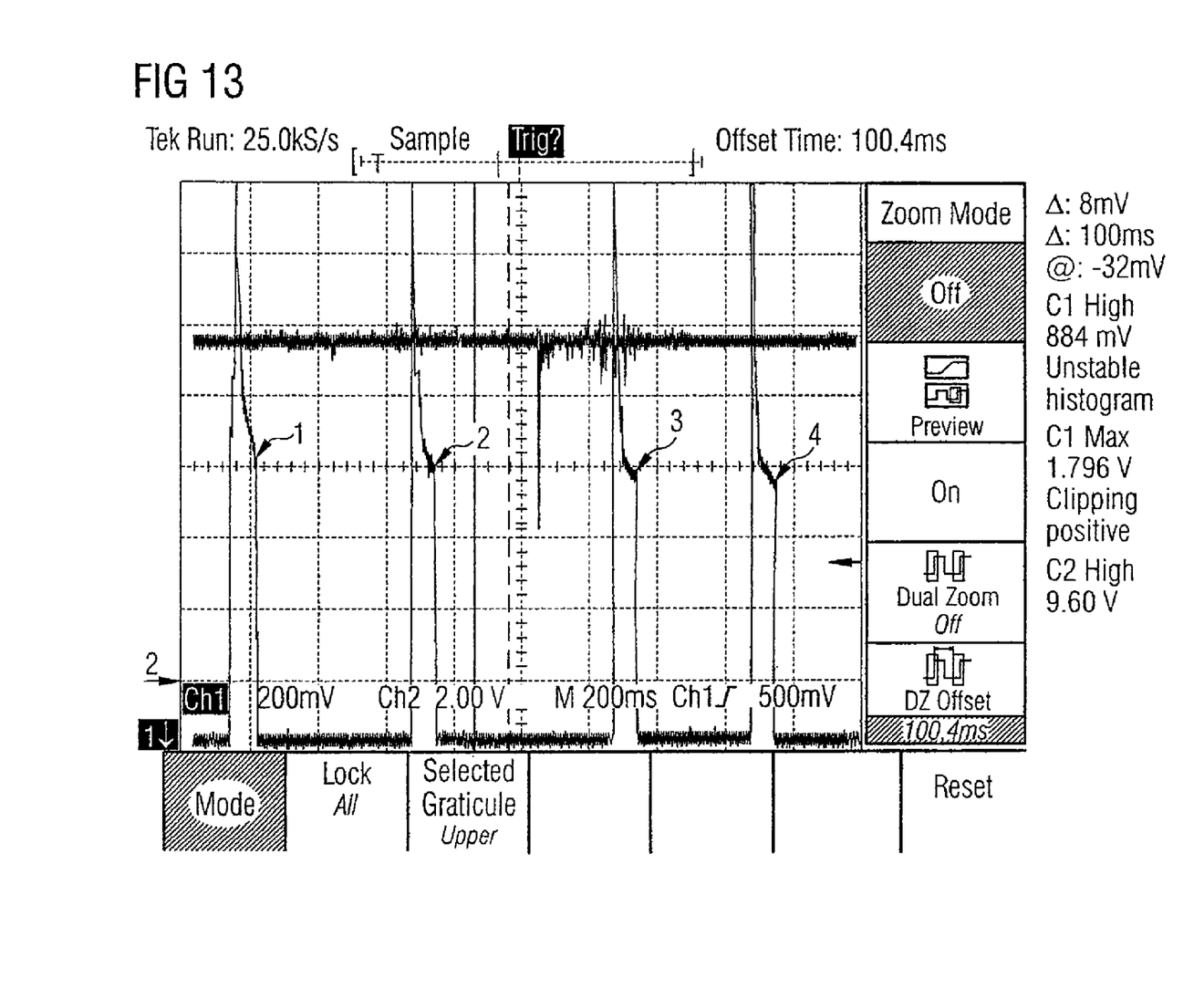
FIG. 13 shows a progression of a bonding process with four bondings with good bonding progression.
Figure 14:
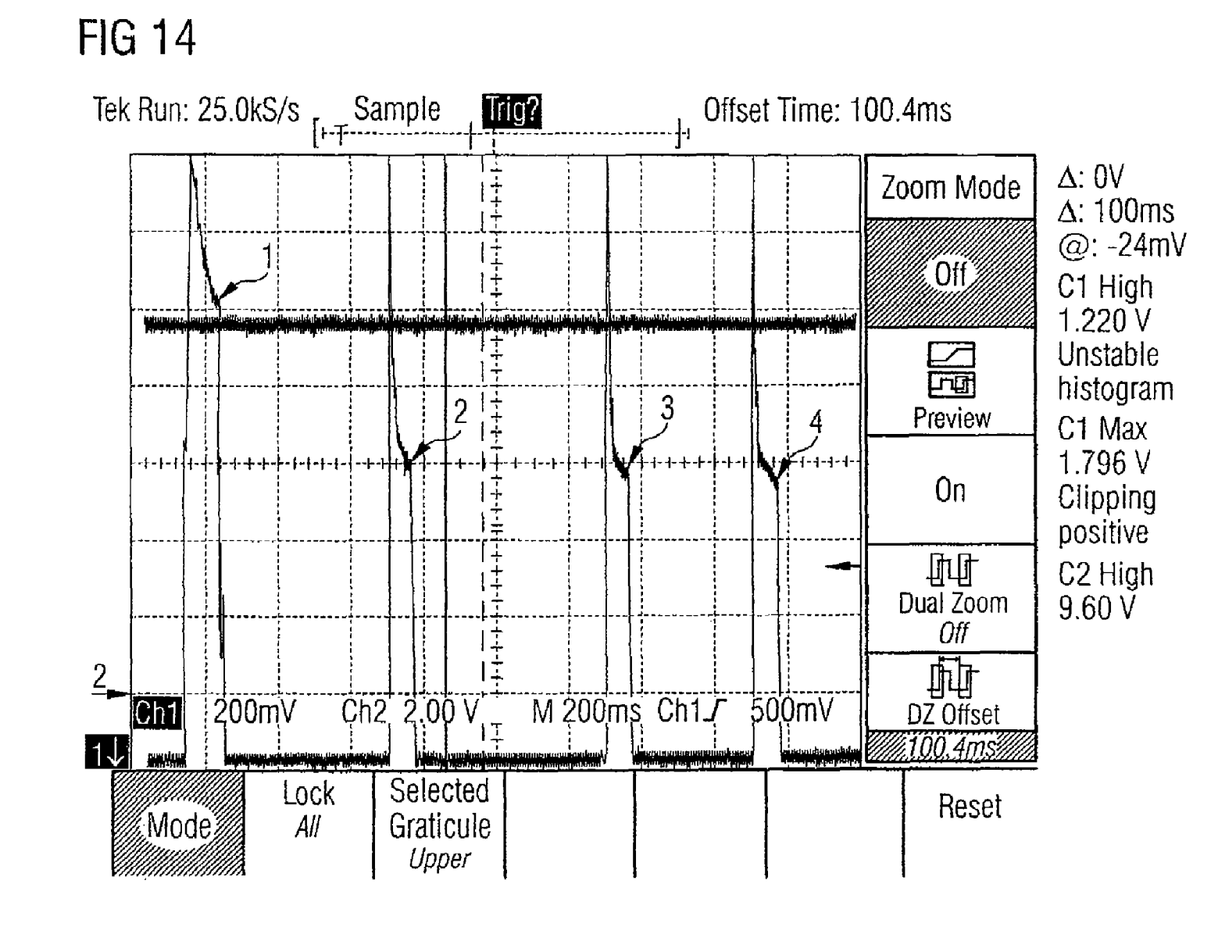
FIG. 14 shows a progression of a bonding process with four bonds with poor bonding progression of the first bonding.

FIGS. 13 and 14 illustrate two bonding progressions, which differ significantly in their bonding quality of the first bond, without the functionality being restricted.

In FIG. 13, point 1 is elevated slightly in comparison with the other end points of the bonding progressions (points 2, 3 and 4). In FIG. 14, however, point 1 lies significantly higher than points 2, 3 and 4, which means that considerably less energy was applied to the bonding at point 1, and consequently the quality of the bonding is inferior to that at point 1 in FIG. 13. It is possible by this evaluation to determine such bonds of inferior quality and, if appropriate, declare them as 1b stock or segregate them.

Figure 9:
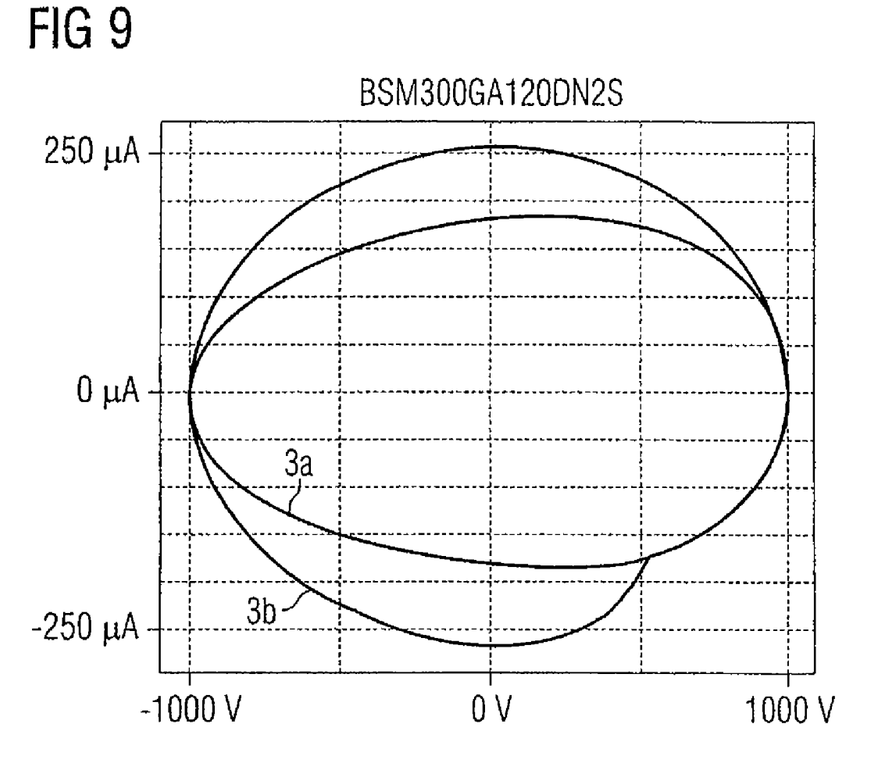
FIG. 9 shows a variation of the impedance during a bonding process.

FIG. 9 shows the variation over time of an impedance during a bonding process in which an AC voltage is applied between the underside of the substrate and the bonding device according to the bonding device represented in FIG. 4. During the bonding process, the electrical variable, in the present case the impedance between the substrate and the emitter that is just to be bonded, is consequently acquired over time in dependence on the AC voltage applied. If there is a short-circuited connection between the gate and the emitter to be bonded, the variation over time of the impedance in dependence on the variation of the AC voltage is for the most part elliptical (see curve 3a in FIG. 9). If no damage occurs during the bonding process, an irregular bulge is evident in the variation over time of the impedance in the otherwise for the most part elliptical progression (see curve 3b in FIG. 9). It is consequently also possible in the case of a measurement with AC voltage to detect during the bonding process whether there is any damage to the component.

To measure the electrical properties of the semiconductor element or of the substrate with the measuring device represented in FIG. 4, the terminals 26, 27 may also be connected directly to terminals 33, 34 of terminal areas 2, 35. Although this connection is difficult to produce during the very quickly performed bonding process, it allows a still more precise measurement of the electrical properties of the substrate or of the semiconductor element. It is also possible for a gate terminal to be connected to an output of the AC voltage on one side and the conducting base 30 or the bonding device to be connected to the other terminal of the AC voltage on the other side, in order to obtain a very informative electrical measured value. The measured values of the measured capacitance are passed from the measuring device 24 directly to a memory unit 36 for storage. The latter can give the measured values a time stamp, by a time acquisition 42 being triggered by the bonding device or a measuring device for the deformation or the reflected ultrasound output.

The fact that the various measured variables are measured and stored in a time-resolved form makes it possible both online and also retrospectively in the analysis of a bonding operation to state precisely which operations are responsible for an electrical property of the semiconductor device or the substrate changing, and whether or not this was desirable.

Figure 10:
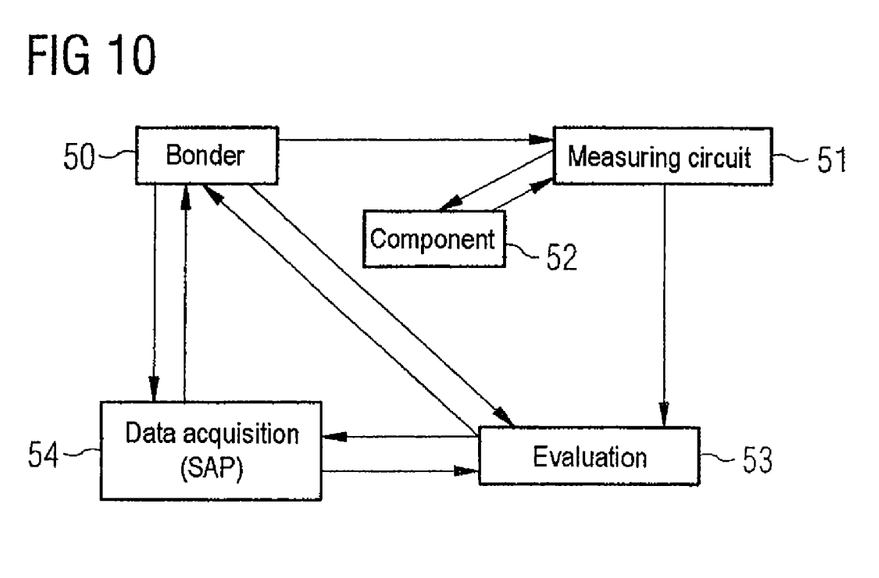
FIG. 10 shows a block diagram of a device according to the invention with a bonder, a measuring circuit, a component to be bonded and measured, an evaluating device and also a data acquisition device.
Figure 11:
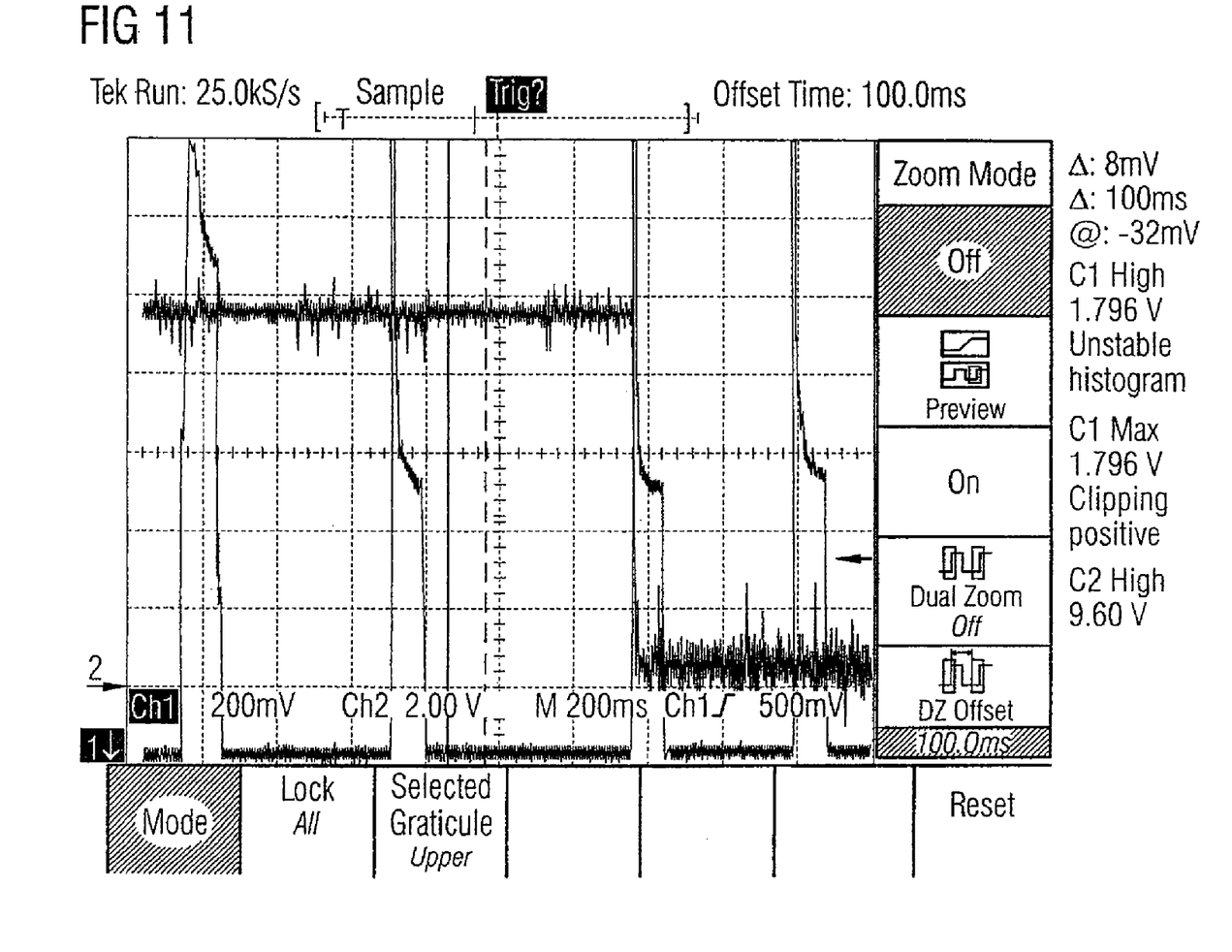
FIG. 11 shows a progression of a bonding process with destruction of the third bond.

FIG. 10 shows a block diagram of the device according to the invention with a bonder 50, a measuring circuit 51, a component 52 to be bonded and to be measured, an evaluating device 53 and also a data acquisition device 54, on the basis of which the different signal flows and storage possibilities of determined data are explained. For this purpose, firstly the following table gives an overview of which elements of the device exchange which types of data or signals.

| From | Bonder | Component | Measuring circuit | Evaluation | Data acquisition |
|---|---|---|---|---|---|
| Bonder | | — | Trigger | Signals | Data |
| Component | — | | Measured value | — | — |
| Measuring circuit | — | Measuring signal | | Measured values | — |
| Evaluation | Data | — | — | | Data |
| Data acquisition | Data | — | — | Data | |

The bonder 50 firstly passes a triggering signal to the measuring circuit 51, to start the respective measurement. A measuring signal is applied by the measuring circuit 51 to the component 52. As described on the basis of FIG. 4, this may also take place contactlessly. From the component 52, the measuring signal changed by the component 52 is returned as a measured value to the measuring circuit 51. The preprocessed measured values are transferred by the measuring circuit 52 to the evaluating device 53.

The bonder 50 additionally passes further signals, such as for example the reflected ultrasound output or the deformation progression, directly to the evaluating device 53. Finally, the bonder 50 also communicates with the data acquisition device 54 and provides it with all the bonding parameters, in order that each component 52 can be assigned the bonding parameters after completion of the bonding process. In particular, the bonding parameters are in this case stored in a time-resolved form, in order that the different bonding parameters can be assigned to the different steps of the bonding process and the bonding contacts thereby produced, whereby in turn, with knowledge of the sequence in which the individual bonding contacts are produced, location-resolved storage is made possible.

The corresponding setpoint progressions of the signals are prescribed to the evaluating unit 53 by the data acquisition device 54. Once the evaluating unit 53 has received all the bonding parameters from the bonder 50 and the measuring results from the measuring circuit 51, the evaluation of the data obtained is carried out. Depending on the result of the evaluation, the following data are transmitted from the evaluating unit 53 to the bonder 50: after comparison of the actual progressions with the setpoint progressions of the measured signals, the evaluating unit 53 supplies a signal as to whether the bonding process of the present component 52 is to be completely stopped or at least the subsequent bonding process is to be stopped, and a change in the ultrasound output provided by the bonder 50, the bonding force, the bonding time, the times of an increase in the bonding force or the bonding position has to be performed before the next bonding step. Consequently, an optimization of the bonding process can be carried out during the bonding process, whereby damage to components can be avoided and losses can be reduced.

The evaluating device 53 also sends the data acquisition device 54 information on the corresponding actual progressions of the signals for the individual component 52 or for entire batches, on the quality of the components and whether a component 52 is to be segregated, and further data, for example with respect to the deforming of the bonding wire or the state of the bonding stamp.

The data acquisition device 54 acquires all the data obtained and assigns it to specific components 52 or entire batches in a time-resolved and location-resolved form. Furthermore, on the one hand the setpoint progressions provided for the evaluating device 53, including the allowed ranges of variation of the signals to be expected and on the other hand the bonding parameters provided for the bonder 50, in particular the allowed ranges of variation of the bonding parameters, or possible changes of the bonding parameters, are stored in the data acquisition device. The data acquisition device 54 initiates a discontinuation of the bonding process by a signal to the bonder 50 if, for example, the state of the bonding stamp no longer meets the prescribed requirements.

The method according to the invention allows defects on semiconductor elements to be measured more accurately than previously and, in particular, it can be established whether they were already present before the bonding process or only brought about by the bonding, and if this is the case by which step of the bonding process. As a result, the bonding method can be further optimized and losses can be reduced or defective batches of semiconductor elements can be rejected. The invention can at the same time similarly be applied in the case of nailhead bonding and other forms of bonding. Even in the case of existing bonding devices, a corresponding measuring device for an electrical variable, for example an electrical capacitance to be measured, can be retrofitted relatively easily. Corresponding memory devices for storing time-resolved measured values are often already available, for example in production control systems.

The method according to the invention, a corresponding bonding device and a corresponding system consequently make a contribution to improving the production conditions for semiconductor elements.

What is claimed is:

1. A method for bonding a semiconductor element positioned on a substrate, the substrate being positioned on a base which is electrically insulated from a bonding tool, the method comprising:
   coupling a first terminal of a power source to a terminal of the bonding tool and a second terminal of the power source to a terminal of the base so that the substrate is capacitively coupled to the base and the base is capacitively coupled to the bonding tool to form an overall capacitance between the semiconductor element and the bonding tool;
   actuating the bonding tool to connect a contact area of the semiconductor element to a terminal area of the substrate by means of a bonding wire element; and
   measuring an electrical variable influenced by the semiconductor element to determine whether the overall capacitance changes while the contact area is being connected to the terminal area.

2. The method as claimed in claim 1, wherein the electrical variable is an impedance, a voltage, a leakage current or an IV characteristic.

3. The method as claimed in claim 1, wherein the electrical variable is acquired by applying a DC or AC voltage.

4. The method as claimed in claim 1, wherein the electrical variable is continuously acquired and measured values are stored in a time-resolved form.

5. The method as claimed in claim 1, wherein the power source applies an AC voltage between the terminal of the bonding tool and the terminal of the base.

6. The method as claimed in claim 5, wherein the frequency of the AC voltage is greater than 100 Hz.

7. The method as claimed in claim 1, further comprising acquiring at least measured values of one of reflected ultrasound output and deformation of a bonding wire.

8. The method as claimed in claim 7, wherein each acquired measured value is stored in a time-resolved form.

9. The method as claimed in claim 8, wherein the time resolution is dimensioned in time intervals of equal length of a triggering signal of the bonding device.

10. The method as claimed in claim 7, wherein each acquired measured value is stored in a location-resolved form.

11. The method as claimed in claim 7, wherein the acquired measured values are stored in a memory device together with an identification parameter of the individual semiconductor element.

* * * * *

UNITED STATES PATENT AND TRADEMARK OFFICE
CERTIFICATE OF CORRECTION

PATENT NO. : 7,654,434 B2  Page 1 of 1
APPLICATION NO. : 11/276991
DATED : February 2, 2010
INVENTOR(S) : Siepe et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 989 days.

Signed and Sealed this

Twenty-third Day of November, 2010

David J. Kappos
*Director of the United States Patent and Trademark Office*